(12) United States Patent
Imai

(10) Patent No.: US 11,061,311 B2
(45) Date of Patent: Jul. 13, 2021

(54) LIGHT EMITTER AND PROJECTOR

(71) Applicant: SEIKO EPSON CORPORATION, Tokyo (JP)

(72) Inventor: Yasutaka Imai, Suwa (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 16/618,082

(22) PCT Filed: May 22, 2018

(86) PCT No.: PCT/JP2018/019641
§ 371 (c)(1),
(2) Date: Nov. 27, 2019

(87) PCT Pub. No.: WO2018/221317
PCT Pub. Date: Dec. 6, 2018

(65) Prior Publication Data
US 2020/0142289 A1 May 7, 2020

(30) Foreign Application Priority Data
May 31, 2017 (JP) .............................. JP2017-108389

(51) Int. Cl.
| | |
|---|---|
| *G03B 21/20* | (2006.01) |
| *H04N 9/31* | (2006.01) |
| *F21V 7/30* | (2018.01) |
| *F21V 9/32* | (2018.01) |
| *F21V 9/40* | (2018.01) |

(52) U.S. Cl.
CPC .............. *G03B 21/204* (2013.01); *F21V 7/30* (2018.02); *F21V 9/32* (2018.02); *F21V 9/40* (2018.02); *H04N 9/3197* (2013.01)

(58) Field of Classification Search
CPC ........... G03B 21/204; F21V 7/30; F21V 9/32; F21V 9/40; H04N 9/3197
USPC .......................................................... 353/31
See application file for complete search history.

(56) References Cited

U.S. PATENT DOCUMENTS

| | | | |
|---|---|---|---|
| 2006/0076878 A1 | 4/2006 | Saito | |
| 2010/0328625 A1 | 12/2010 | Miyazaki et al. | |
| 2011/0062453 A1 | 3/2011 | Armitage | |
| 2011/0090696 A1* | 4/2011 | Nagai | H01L 33/505 362/293 |
| 2012/0200218 A1 | 8/2012 | Maemura et al. | |
| 2013/0056775 A1* | 3/2013 | Kawakami | F21V 13/08 257/98 |
| 2013/0257264 A1 | 10/2013 | Tamaki et al. | |
| 2016/0348856 A1* | 12/2016 | Owada | F21S 43/20 |

(Continued)

FOREIGN PATENT DOCUMENTS

| | | |
|---|---|---|
| JP | H06176692 A | 6/1994 |
| JP | 2003-20476 A | 1/2003 |

(Continued)

*Primary Examiner* — Jerry L Brooks
(74) *Attorney, Agent, or Firm* — Harness, Dickey & Pierce, P.L.C.

(57) ABSTRACT

A light emitter including a base, a light source that outputs light, and a phosphor that is provided in a form of a film at a first surface of the base and emits light when irradiated with the light outputted from the light source. A second surface of the phosphor that is a surface opposite the base has an irregular shape, and the light source radiates the light obliquely with respect to the irregular shape.

8 Claims, 9 Drawing Sheets

(56) References Cited

U.S. PATENT DOCUMENTS

| | | | |
|---|---|---|---|
| 2017/0184254 A1* | 6/2017 | Yamashita | ............ F21S 41/16 |
| 2017/0235127 A1 | 8/2017 | Sprague et al. | |
| 2018/0138027 A1 | 5/2018 | Oku et al. | |
| 2019/0097095 A1 | 3/2019 | Yamanaka et al. | |

FOREIGN PATENT DOCUMENTS

| | | |
|---|---|---|
| JP | 2006-179658 A | 7/2006 |
| JP | 2008-169060 A | 7/2008 |
| JP | 2008-218477 A | 9/2008 |
| JP | 2009-283876 A | 12/2009 |
| JP | 2011-100163 A | 5/2011 |
| JP | 2012-104267 A | 5/2012 |
| JP | 5008631 B2 | 6/2012 |
| JP | 2012-162600 A | 8/2012 |
| JP | 2013-203822 A | 10/2013 |
| WO | WO-2013-103039 A1 | 7/2013 |
| WO | WO-2017-026118 A1 | 2/2017 |
| WO | WO-2017-195620 A1 | 11/2017 |

\* cited by examiner

[Fig. 1]
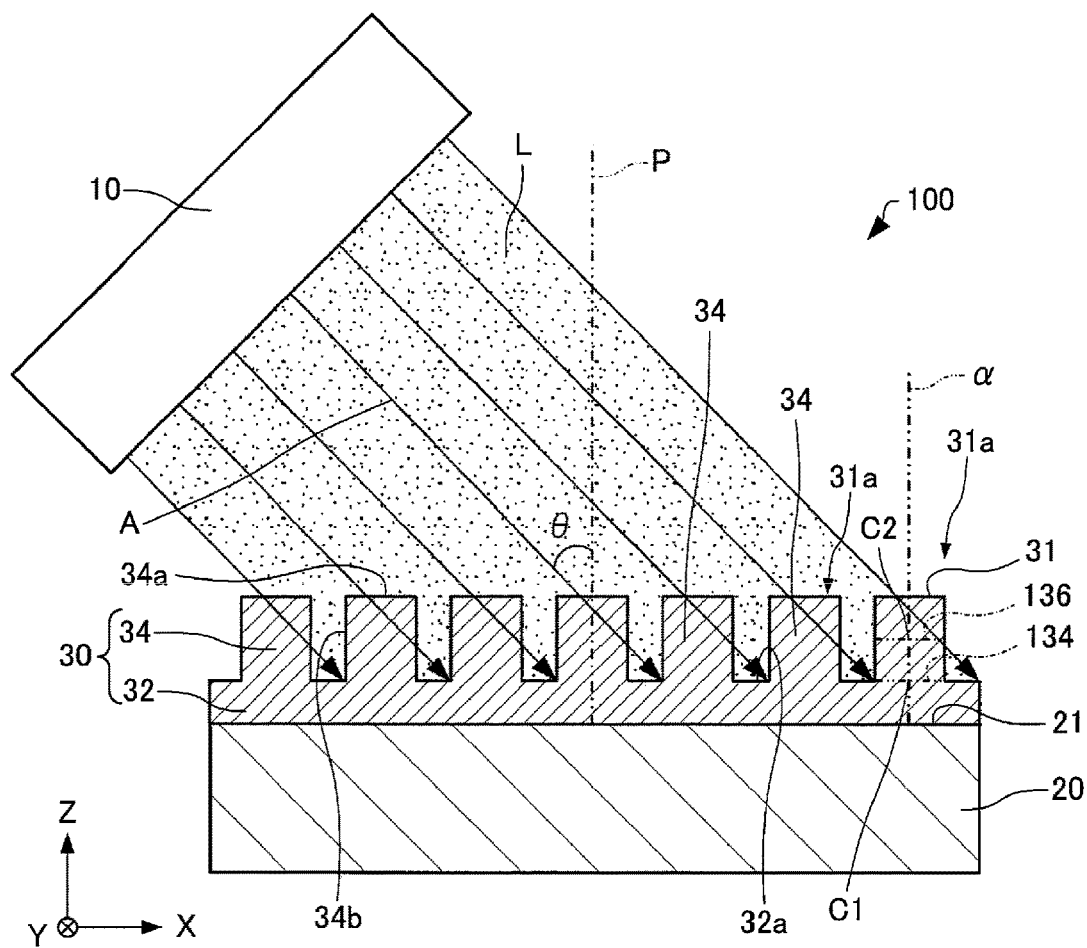
[Fig. 2]
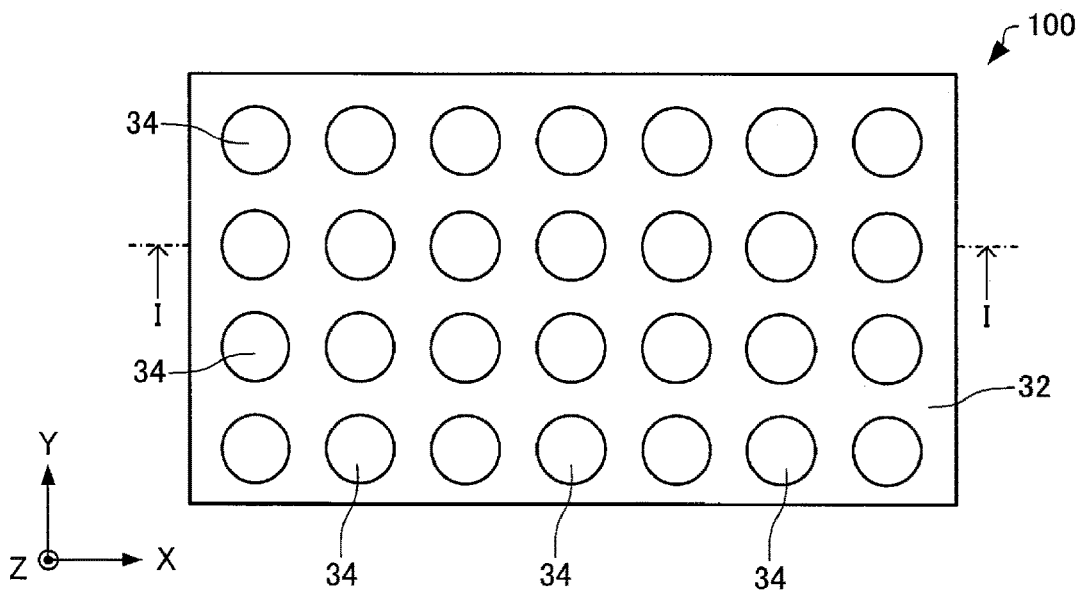

[Fig. 3]
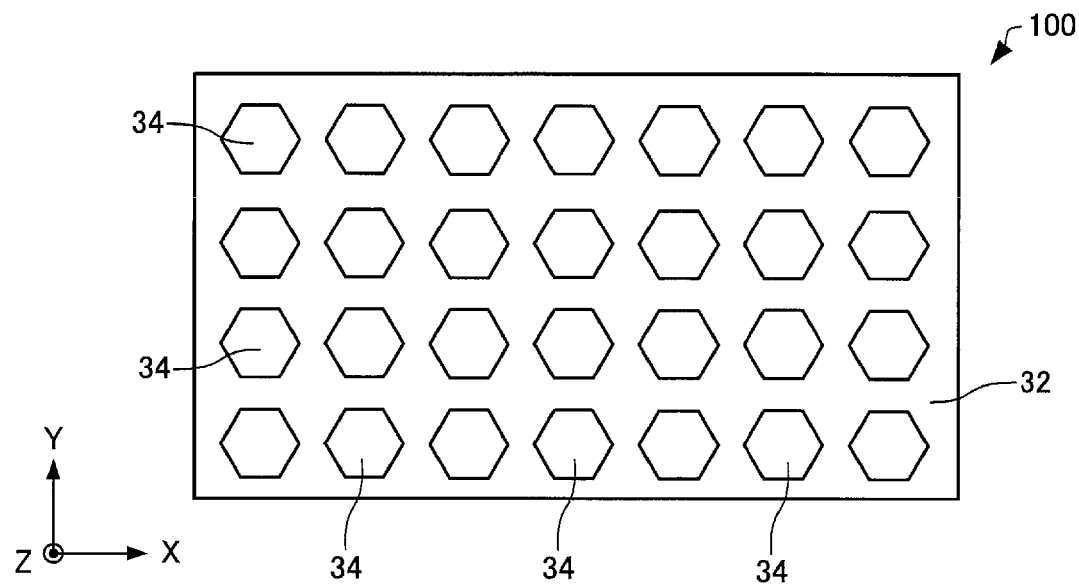
[Fig. 4]
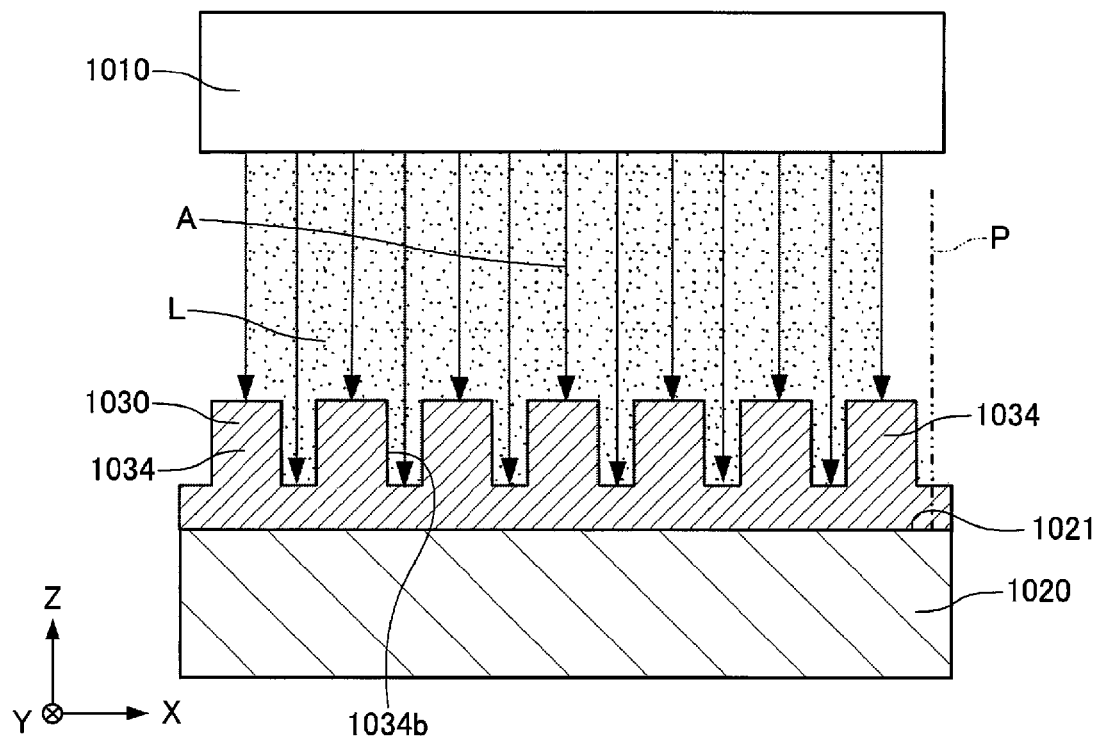

[Fig. 5]
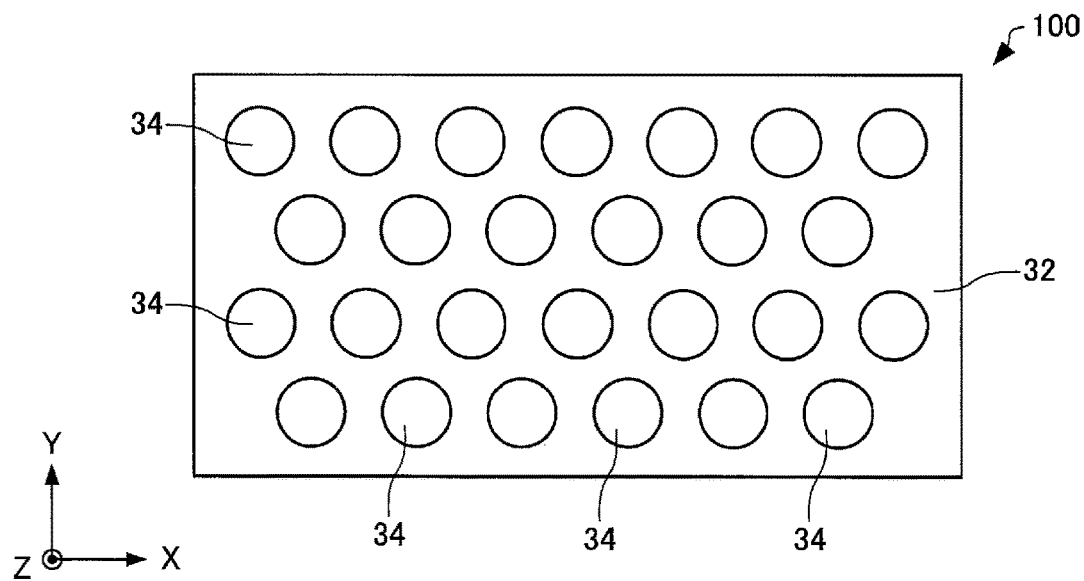
[Fig. 6]
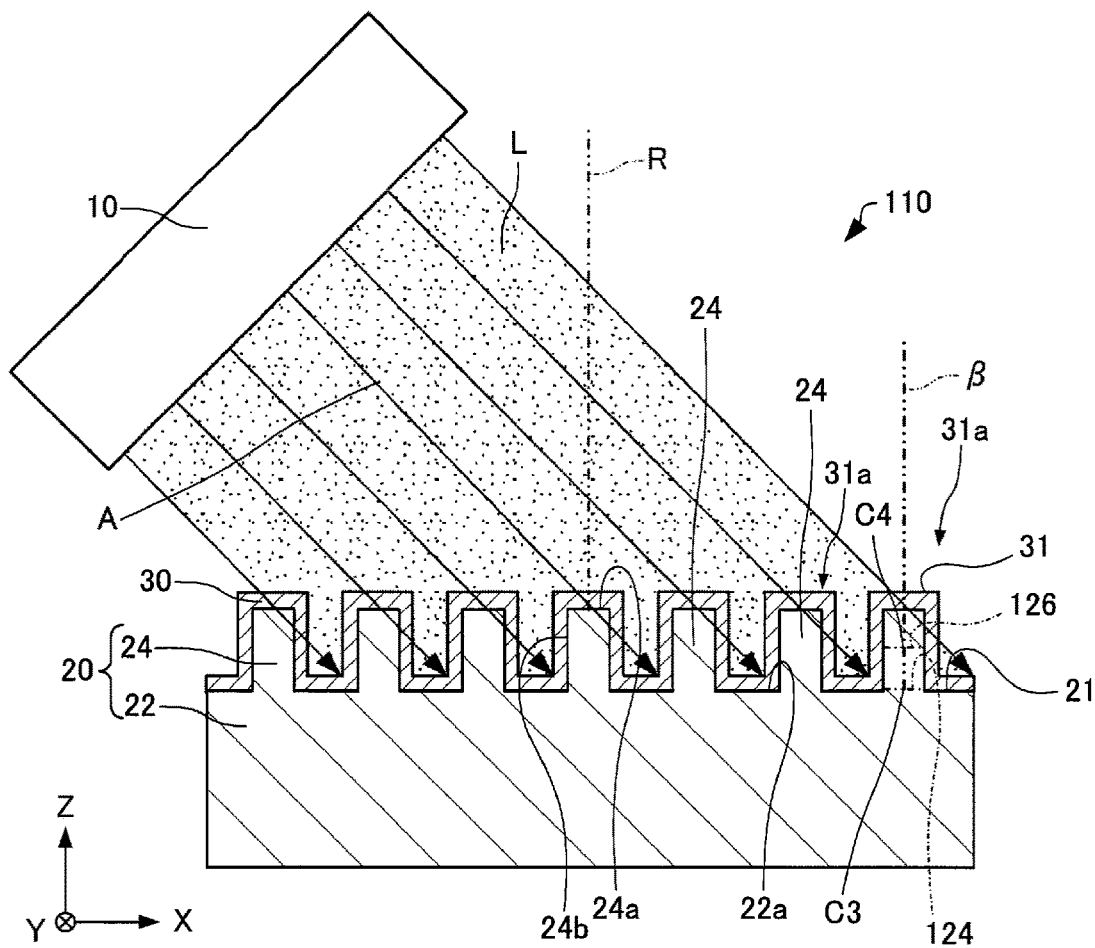

[Fig. 7]
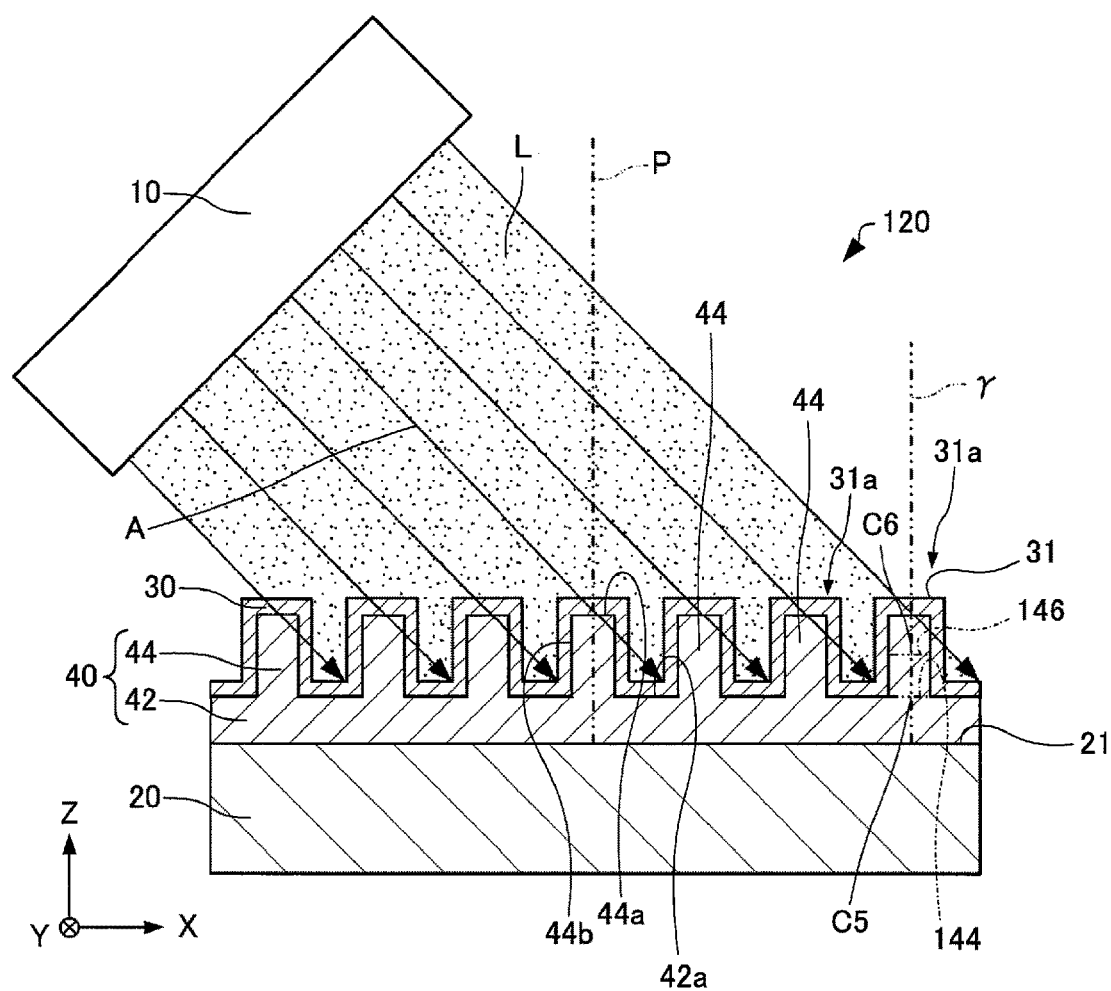

[Fig. 8]
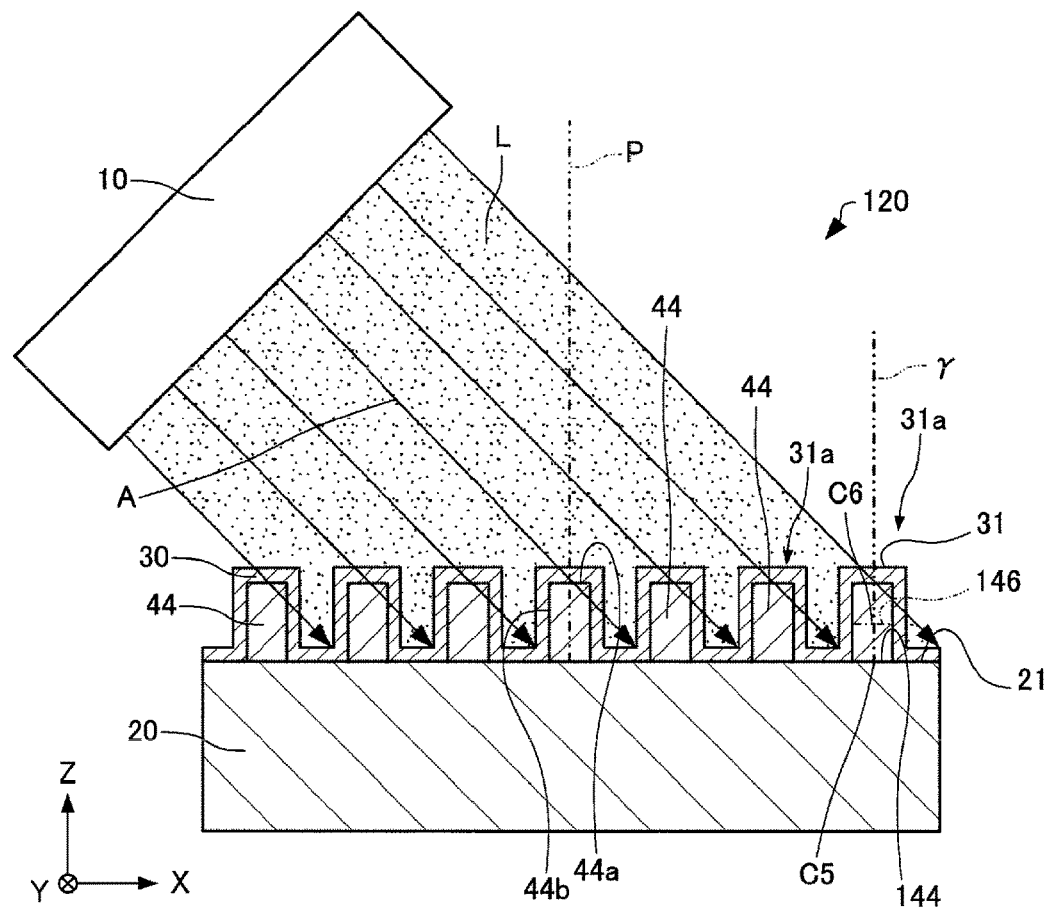
[Fig. 9]
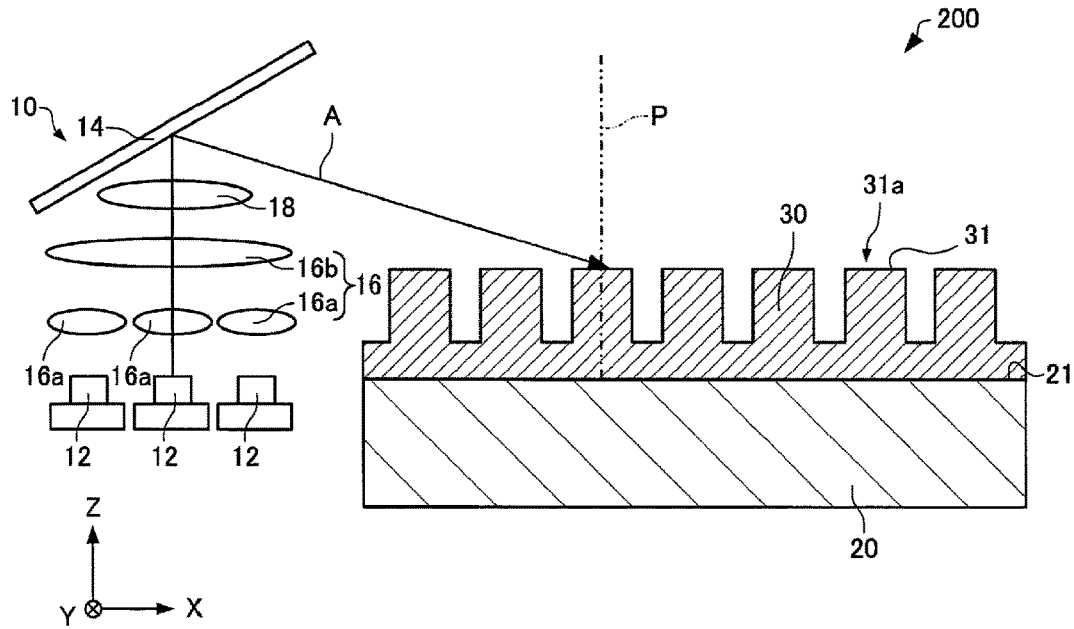

[Fig. 10]
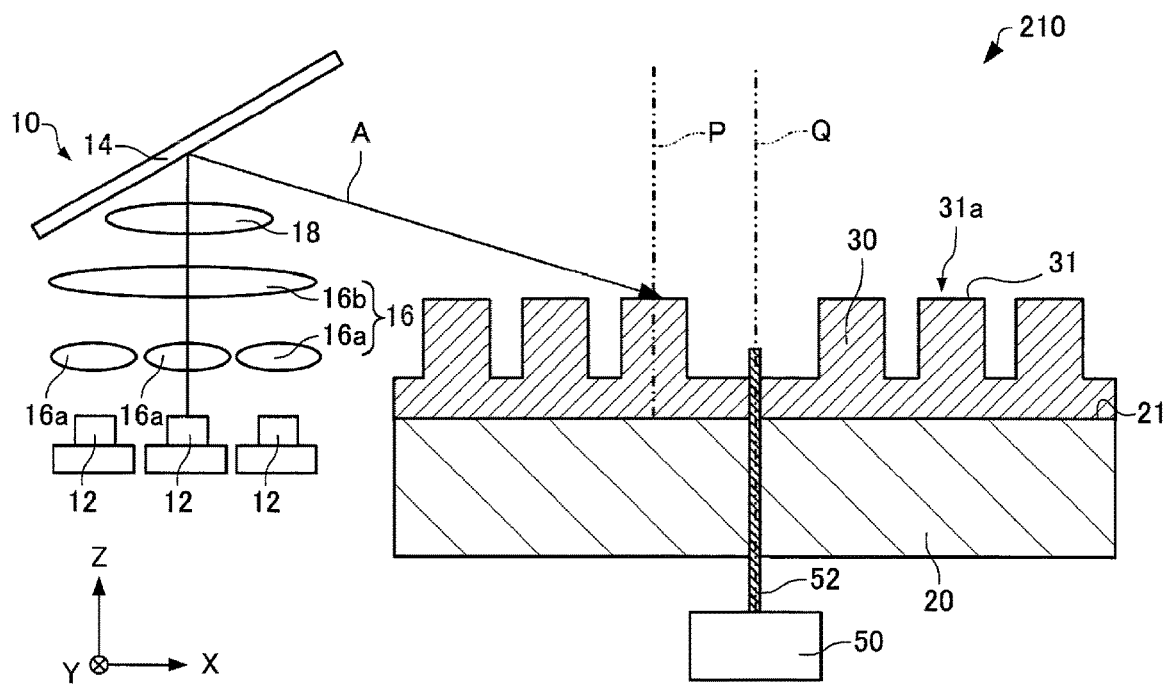

[Fig. 11]
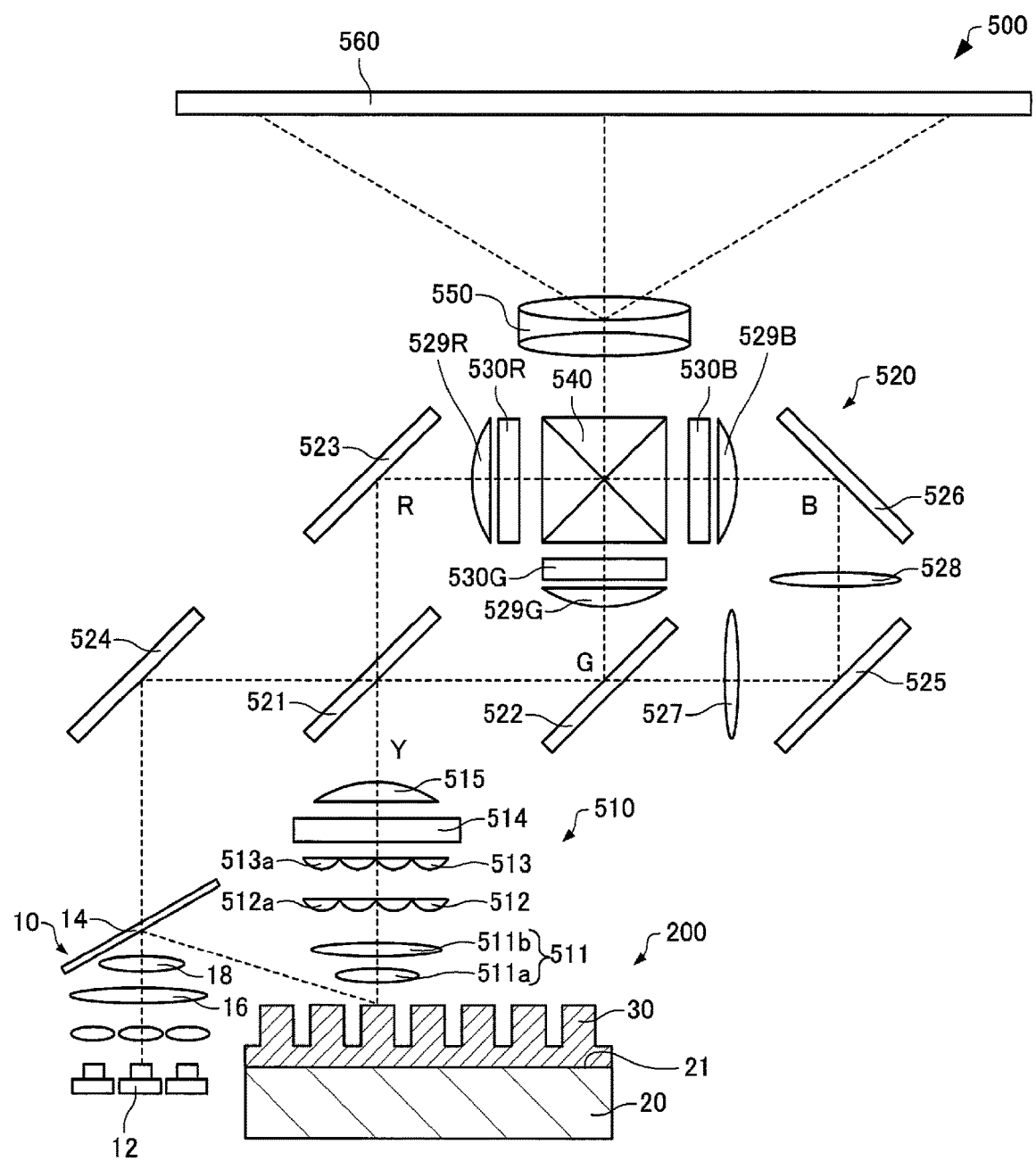

[Fig. 12]
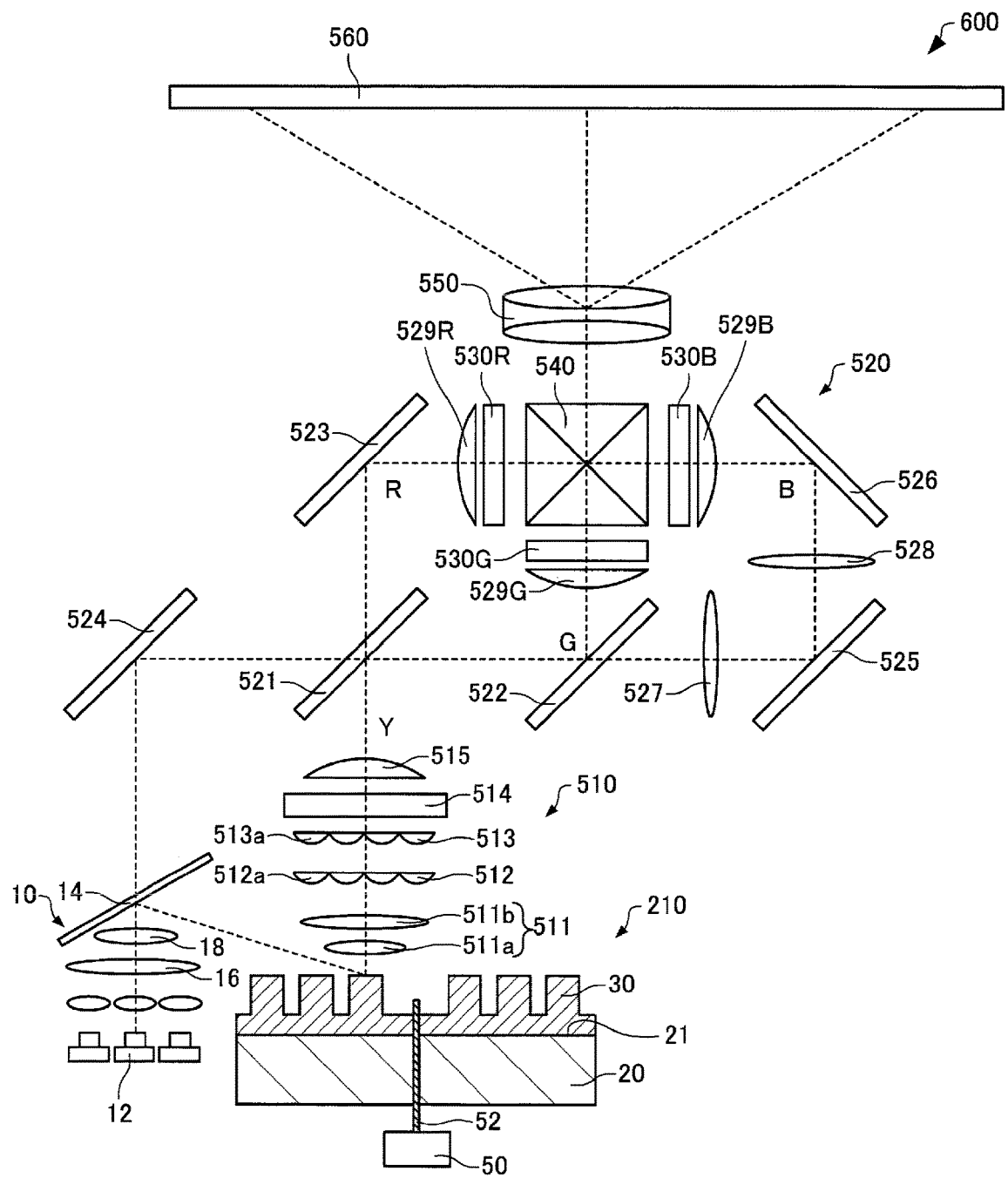

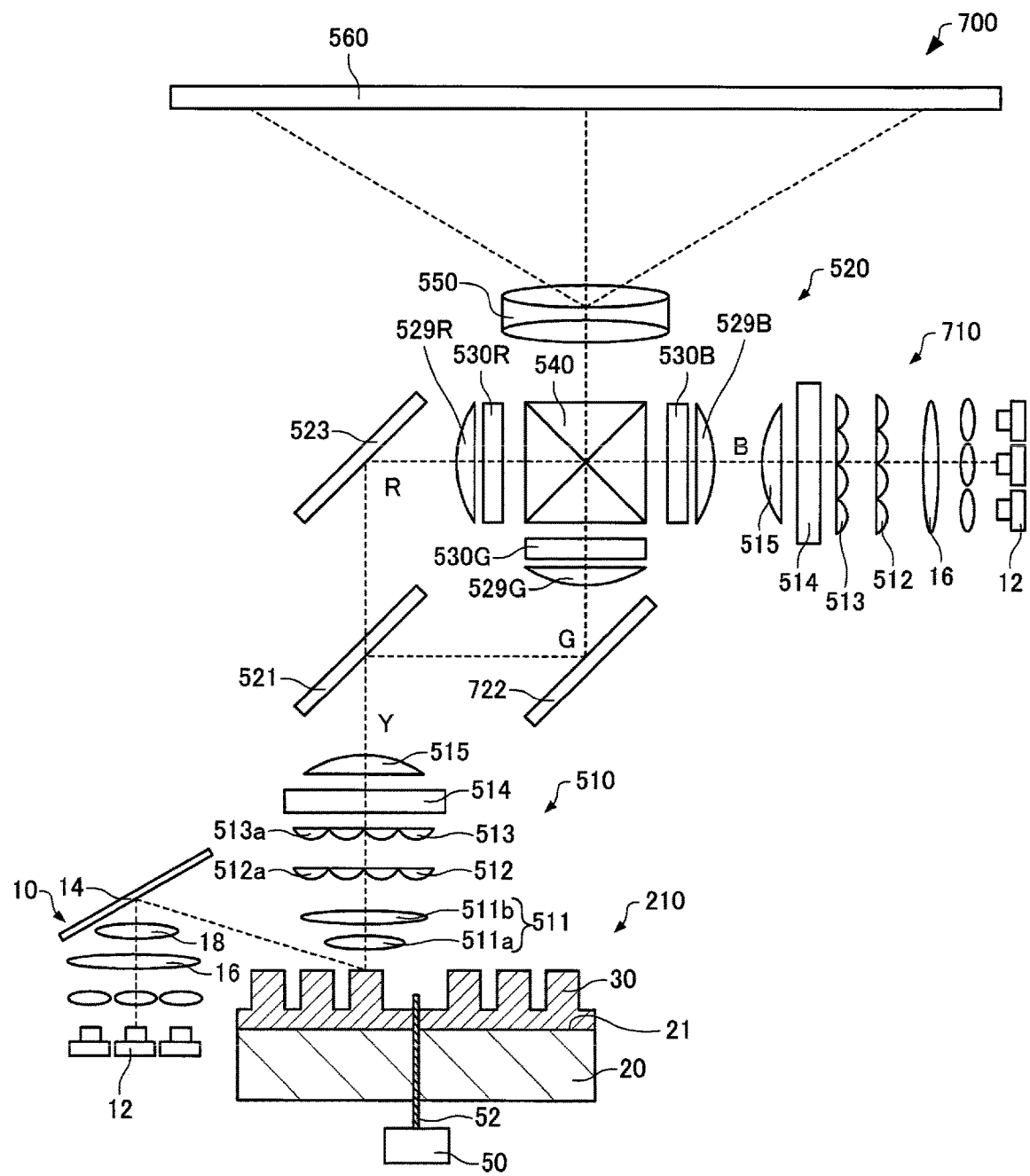
[Fig. 13]

LIGHT EMITTER AND PROJECTOR

CROSS REFERENCE TO RELATED APPLICATIONS

This application is a U.S. National Phase application of International Application No. PCT/JP2018/019641, filed on May 22, 2018 and published in Japanese as WO 2018/221317 A1 on Dec. 6, 2018, which is based on, and claims priority from JP Application Serial Number 2017-108389, filed on May 31, 2017. The disclosures of both of the above applications are hereby incorporated by reference herein in their entirety.

BACKGROUND

1. Technical Field

The present disclosure relates to a light emitter and a projector.

2. Related Art

A projector of related art typically uses a discharge lamp, such as an ultrahigh-pressure mercury lamp, as a light source. A discharge lamp of this type, however, has problems, such as a relatively short life, a difficulty in instantaneous light emission, and degradation of a liquid crystal light valve due to ultraviolet light radiated from the lamp. To avoid the problems, a projector using a light source based on a scheme that replaces a discharge lamp has been proposed.

For example, JP-A-2011-100163 describes a light source apparatus (light emitter) provided in a projector and including a light emitting plate on which a fluorescent layer that receives excitation light and emits light that belongs to a predetermined wavelength band is formed and a light source that irradiates the fluorescent layer with the excitation light along a normal to the upper surface of the fluorescent layer.

In the light emitter described above, the temperature of the fluorescent layer increases and the light emission efficiency decreases accordingly in some cases when the fluorescent layer is irradiated with light. To solve the problem, it is conceivable to increase the surface area of the light irradiated surface of the fluorescent layer irradiated with the excitation light by imparting an irregular shape to the light irradiated surface to improve the heat dissipation capability.

In the light emitter including the fluorescent layer having the light irradiated surface having an irregular shape, however, the side surface of each of the protrusions that form the irregular shape is not irradiated with the excitation light, resulting in a decrease in the light emission efficiency in some cases.

SUMMARY

An object of some aspect of the disclosure is to provide a light emitter capable of improving the light emission efficiency. Another object of some aspect of the disclosure is to provide a projector capable of outputting light having high luminance.

A light emitter according to an aspect of the disclosure includes a base, a light source that outputs light, and a phosphor that is provided in a form of a film at a first surface of the base and emits light when irradiated with the light outputted from the light source, a second surface of the phosphor that is a surface opposite the base has an irregular shape, and the light source radiates the light obliquely with respect to the irregular shape.

The light emitter described above can irradiate the side surface of each of the protrusions that form the irregular shape of the second surface with the light outputted from the light source. The light emitter can therefore have improved light emission efficiency.

In the light emitter according to the aspect of the disclosure, a direction of an optical axis of the light outputted from the light source may intersect a direction in which protrusions that form the irregular shape protrude.

The light emitter described above can irradiate the side surface of each of the protrusions that form the irregular shape of the second surface with the light outputted from the light source.

In the light emitter according to the aspect of the disclosure, the protrusions may each have a hexagonal shape in a plan view viewed along a normal to the first surface.

In the light emitter according to the aspect of the disclosure, the phosphor may include a planar plate section that is provided at the first surface and has the shape of a planar plate, and protruding sections that protrude from the planar plate section, and the irregular shape may be formed by the planar plate section and the protruding sections.

In the light emitter described above, the irregular shape of the second surface of the phosphor can be achieved, for example, without processing the base into the irregular shape.

In the light emitter according to the aspect of the disclosure, the base may include a planar plate section having a shape of a planar plate, and protruding sections that protrude from the planar plate section, and the irregular shape may be formed by the planar plate section and the protruding sections.

In the light emitter described above, the irregular shape can be formed in the second surface of the phosphor without processing the phosphor but only by depositing the phosphor on the first surface of the base.

The light emitter according to the aspect of the disclosure may further include a base layer provided between the base and the phosphor, the phosphor may be provided at the first surface via the base layer, the base layer may include a planar plate section provided at the first surface and having a shape of a planar plate, and protruding sections that protrude from the planar plate section, and the irregular shape is formed by the planar plate section and the protruding sections.

In the light emitter described above, the irregular shape of the second surface of the phosphor can be formed without processing the phosphor or the base.

The light emitter according to the aspect of the disclosure may further include a driver that rotates the base around an axis extending in a direction in which protrusions that form the irregular shape protrude as an axis of rotation.

The light emitter described above can prevent a fixed region of the phosphor from being irradiated with the light outputted from the light source so that the region melts.

In the light emitter according to the aspect of the disclosure, the light source may include a light emitting device that emits light, and an optical element that deflects an optical axis of the light emitted from the light emitting device.

The light emitter described above allows the light emitted from the light emitting device to be incident on the phosphor via the optical element. The light emitter therefore allows the light emitting device to be arranged with high flexibility.

A projector according to another aspect of the disclosure includes a base, a light source that outputs light, and a phosphor that is provided in a form of a film at a first surface of the base and emits light when irradiated with the light outputted from the light source, a second surface of the phosphor that is a surface opposite the base has an irregular shape, and the light source radiates the light obliquely with respect to the irregular shape.

The projector described above can output light having high luminance.

BRIEF DESCRIPTION OF THE DRAWINGS

FIG. 1 is a cross-sectional view diagrammatically showing a light emitter according to a first embodiment.

FIG. 2 is a plan view diagrammatically showing the light emitter according to the first embodiment.

FIG. 3 is a plan view diagrammatically showing the light emitter according to the first embodiment.

FIG. 4 is a cross-sectional view diagrammatically showing a light emitter according to Reference Example.

FIG. 5 is a plan view diagrammatically showing the light emitter according to the first embodiment.

FIG. 6 is a cross-sectional view diagrammatically showing a light emitter according to a first variation of the first embodiment.

FIG. 7 is a cross-sectional view diagrammatically showing a light emitter according to a second variation of the first embodiment.

FIG. 8 is a cross-sectional view diagrammatically showing another light emitter according to the second variation of the first embodiment.

FIG. 9 is a cross-sectional view diagrammatically showing a light emitter according to a second embodiment.

FIG. 10 is a cross-sectional view diagrammatically showing a light emitter according to a variation of the second embodiment.

FIG. 11 diagrammatically shows a projector according to a third embodiment.

FIG. 12 diagrammatically shows a projector according to a first variation of the third embodiment.

FIG. 13 diagrammatically shows a projector according to a second variation of the third embodiment.

DESCRIPTION OF EXEMPLARY EMBODIMENTS

Preferable embodiments of the disclosure will be described below in detail with reference to the drawings. It is not intended that the embodiments described below unduly limit the contents of the disclosure set forth in the claims. Further, all configurations described below are not necessarily essential configuration requirements of the disclosure.

1. First Embodiment 1.1. Light Emitter

A light emitter according to a first embodiment will first be described with reference to the drawings. FIG. 1 is a cross-sectional view diagrammatically showing a light emitter 100 according to the first embodiment. FIG. 2 is a plan view diagrammatically showing the light emitter 100 according to the first embodiment. FIG. 1 is a cross-sectional view taken along the line I-I in FIG. 2. In FIGS. 1 and 2, axes X, Y, and Z are drawn as three axes perpendicular to one another.

The light emitter 100 includes a light source 10, a base 20, and a phosphor 30, as shown in FIGS. 1 and 2. In FIG. 2, the light source 10 is omitted for convenience.

The light source 10 outputs light (excitation light) L, which causes the phosphor 30 to be excited. The light source 10 outputs the light L obliquely with respect to a first surface 21 of the base 20. An optical axis A of the light L outputted from the light source 10 (hereinafter also simply referred to as "light L"), for example, intersects a normal P to the first surface 21. In the example shown in FIGS. 1 and 2, the normal P is parallel to the axis Z. The light L is incident on the phosphor 30 along the direction that intersects the normal P. The optical axis A is an axis parallel to a light ray having the highest intensity out of the light rays that form the light L. The direction of the optical axis A (direction in which optical axis A extends) intersects the thickness direction of the base 20. An angle θ between the normal P and the optical axis A is, for example, greater than or equal to 5° but smaller than or equal to 45°, preferably, greater than or equal to 20° but smaller than or equal to 40°.

The light L outputted from the light source 10 is, for example, blue light. The wavelength of the light L is, for example, longer than or equal to 435 nm but shorter than or equal to 480 nm. The light source 10 is formed, for example, of a light emitting device, such as a laser and an LED (light emitting diode). The light source 10 may be formed of light emitting devices arranged in an array.

The base 20 has, for example, the shape of a planar plate. The base 20 has the first surface 21. In the example shown in FIGS. 1 and 2, the first surface 21 is a planar surface. The base 20 is made, for example, of Al, Cu, GaN, or sapphire. The base 20 may be formed of a laminate of a sapphire substrate and a GaN layer having the first surface 21.

The phosphor 30 is provided in the form of a film on the first surface 21 of the base 20. In the example shown in FIGS. 1 and 2, the phosphor 30 is so provided as to cover the entire first surface 21. The phosphor 30 emits light when irradiated with the light L outputted from the light source 10. Specifically, for example, the phosphor 30 absorbs the light L and emits light in the form of fluorescence. The fluorescence is produced particularly at the surface of the phosphor 30. The light L may or may not be incident the base 20 as long as the light L is incident on the phosphor 30. In the embodiment of the disclosure, the phosphor refers to an object that emits light when irradiated with light but is not limited to an object that emits light in the form of fluorescence and includes, for example, an object that emits light in the form of phosphorescence.

The light emitted by the phosphor 30 is, for example, yellow light. The wavelength of the light emitted by the phosphor 30 is, for example, longer than or equal to 580 nm but shorter than or equal to 595 nm. The phosphor 30 is made, for example, of sialon (ceramic material made of silicon, aluminum, oxygen, and nitrogen), YAG (crystal material having garnet structure made of yttrium and aluminum), or InGaN.

The phosphor 30 includes, for example, a planar plate section 32 and a protruding section 34. The planar plate section 32 is provided on the first surface 21. The planar plate section 32 has the shape of a planar plate. The thickness (size in axis-Z direction) of the planar plate section 32 is, for example, greater than or equal to 0.1 µm but smaller than or equal to 10 µm.

The protruding section 34 protrudes from the planar plate section 32 toward the positive side of the axis-Z direction. The protruding section 34 has a columnar shape. The protruding section 34 has an upper surface (surface facing positive side of axis-Z direction in example shown in FIGS. 1 and 2) 34a and a side surface (surface perpendicular to upper surface 34a in example shown in FIGS. 1 and 2) 34b. The light L is incident on the upper surface 34a and the side surface 34b. The light L is further incident on an upper surface 32a of the planar plate section 32.

The protruding section 34 is formed of a plurality of protruding sections 34. The plurality of protruding sections 34 are so provided as to be separate from one another. In the example shown in FIG. 2, the plurality of protruding sections 34 are arranged in a square lattice in a plan view (viewed along axis-Z direction). The light L is incident on the phosphor 30 along the axis-X or axis-Y direction in the plan view.

The width (size in direction perpendicular to axis-Z direction) of each of the protruding sections 34 is, for example, greater than or equal to 10 nm but smaller than or equal to 5 µm. The height (size in axis-Z direction) of each of the protruding sections 34 is, for example, greater than or equal to 0.1 µm but smaller than or equal to 10 µm. The interval between adjacent protruding sections 34 is, for example, greater than or equal to 5 nm but smaller than or equal to 5 µm.

The protruding sections 34 each have, for example, a circular shape in the plan view (shape viewed along axis-Z direction). Although not shown, the protruding sections 34 may each have an elliptical shape or a polygonal shape, such as a quadrangular or hexagonal shape in the plan view (see FIG. 3) (shape of each of protruding sections 34 in plan view viewed along normal P). In the example shown in FIGS. 1 and 2, the width of each of the protruding sections 34 does not change in the axis-Z direction but may change in the axis-Z direction.

The phosphor 30 has a second surface 31. The second surface 31 is a surface of the phosphor 30 that is the surface opposite the base 20. The second surface 31 has an irregular shape. The irregular shape of the second surface 31 is formed by the planar plate section 32 and the protruding sections 34. The irregular shape of the second surface 31 is a shape that reflects the shapes of the planar plate section 32 and the protruding sections 34. The direction of the optical axis A of the light L intersects the direction in which protrusions 31a, which form the irregular shape of the second surface 31, protrude (axis-Z direction in example shown in FIGS. 1 and 2). In the example shown in FIGS. 1 and 2, the protrusions 31a are formed of the protruding sections 34. The plurality of protrusions 31a protrude, for example, in the same direction.

The light source 10 radiates the light L obliquely with respect to the irregular shape of the second surface 31. The sentence "radiates the light L obliquely with respect to the irregular shape of the second surface 31" means radiating the light in such a way that the direction in which the protrusions 31a, which form the irregular shape of the second surface 31, protrude intersects the direction of the optical axis A of the light L.

In the present embodiment, the "direction in which the protrusions 31a protrude" is the direction of a center line α, which connects a center point C1 of a bottom surface 134 of any of the protruding sections 34 in the plan view viewed along the normal P to a center point C2 of a cross section 136 of the protruding section 34, which is located in the position corresponding to half the height of the protruding section 34 (maximum dimension along normal P), in the plan view viewed along the normal P. The bottom surface of the protruding section 34 is a surface of the protruding section 34 that is the surface in contact with the planar plate section 32. In a case where the bottom surface 134 has a shape other than a circular shape, the "center point C1 of the bottom surface 134" is the center of a minimum circle that circumscribes the shape of the bottom surface 134 (smallest circumscribed circle). Further, when the cross section 136 has a shape other than a circular shape, the "center point C2 of the cross section 136" is the center of a minimum circle that circumscribes the shape of the cross section 136. The "cross section 136 of the protruding section 34, which is located in the position corresponding to half the height of the protruding section 34" is the cross section perpendicular to the center line α of the protruding section 34 and located in the position corresponding to half the height of the protruding section 34.

The light emitter 100 has, for example, the following features.

The light emitter 100 includes the phosphor 30, which is provided in the form of a film on the first surface 21 of the base 20 and emits light when irradiated with the light L outputted from the light source 10, the second surface 31 of the phosphor 30 that is the surface opposite the base 20 has an irregular shape, and the light source 10 radiates the light L obliquely with respect to the irregular shape of the second surface 31. The light emitter 100 can therefore irradiate the side surface of each of the protrusions 31a (side surface 34b of each of protruding sections 34) with the light L. The light emitter 100 can therefore have improved light emission efficiency. Therefore, in the light emitter 100, the power of the light emitted from the phosphor 30 can be maintained even when the power of the light L is lowered. Therefore, in the light emitter 100, when the light source 10 is formed, for example, of a plurality of light emitting devices, the number of light emitting devices can be reduced. As a result, the cost of the light emitter 100 can be lowered. Further, in the light emitter 100, the power of the light L can be lowered, whereby the life of the light emitter 100 can be prolonged. In the embodiment of the disclosure, the sentence "the irregular shape is obliquely irradiated with the light L" expresses "the protruding sections 34 are so irradiated with the light L that the direction in which the protruding sections 34 protrude intersects the direction of the optical axis A of the light L.

For example, as shown in FIG. 4, when the optical axis A of the light L outputted from a light source 1010 is parallel to a normal P to a first surface 1021 (when the direction in which protruding sections 1034 protrude coincides with the direction of the optical axis A), a side surface 1034b of each of the protruding sections 1034 of a phosphor 1030 is not irradiated with the light L. The light emitter 100 can have improved light emission efficiency as compared with the light emitter shown in FIG. 4.

Further, in the light emitter 100, for example, the light L having passed through the protrusions 31a can be incident on at least one of the protrusion 31a adjacent thereto and the planar plate section 32. The light emitter 100 can therefore have improved light emission efficiency.

Further, in the light emitter 100, the plurality of protruding sections 34 are so provided as to be separate from one another. Therefore, in the light emitter 100, the total surface area of the phosphor 30 can be increased as compared with a case where the plurality of protruding section 34 are so provided as to be continuous with each other. The light emitter 100 can therefore have an improved heat dissipation capability.

In the light emitter 100, the direction of the optical axis A of the light L outputted from the light source 10 intersects the direction in which the protrusions 31a, which form the irregular shape of the second surface 31, protrude. Therefore, the light emitter 100 allows the side surface of each of the protrusions 31a to be irradiated with the light L.

In the light emitter 100, the phosphor 30 includes the planar plate section 32, which is provided on the first surface 21 and has the shape of a planar plate, and the protruding sections 34, which protrude from the planar plate section 32, and the irregular shape of the second surface is formed by the planar plate section 32 and the protruding sections 34. Therefore, in the light emitter 100, the irregular shape of the second surface 31 of the phosphor 30 can be achieved, for example, without processing (patterning) the base 20 into the irregular shape.

The plurality of protruding sections 34 may instead be arranged in a triangular lattice in the plan view, as shown in FIG. 5. In this case, the light L is incident on the phosphor 30 in the direction that inclines by 60° with respect to the axis X or in the axis-X direction. In FIG. 5, the light source 10 is omitted for convenience.

Although not shown, the plurality of protruding sections 34 may be provided in the form of stripes in the plan view.

In the example shown in FIG. 1, the direction in which the protruding sections 34 protrude coincides with the direction of the normal P, but not necessarily, and the protruding direction may not coincide with the direction of the normal P. In the case where the protruding direction does not coincide with the direction of the normal P, the normal P and the optical axis A may, for example, be parallel to each other.

1.2. Method for Manufacturing Light Emitter

A method for manufacturing the light emitter 100 according to the first embodiment will next be described with reference to the drawings.

The phosphor 30 is formed on the first surface 21 of the base 20, as shown in FIG. 1. Specifically, a light emitting film (not shown) is first deposited, for example, by CVD (chemical vapor deposition) or sputtering. The light emitting film is then patterned, for example, by photolithography and etching. The etching is terminated before the base 20 is exposed. The phosphor 30 including the planar plate section 32 and the protruding sections 34 can thus be formed.

The light source 10 is then placed in a position where the light source 10 can obliquely output the light L to the first surface 21.

The light emitter 100 can be manufactured by carrying out the steps described above.

1.3. Variations of Light Emitter 1.3.1. First Variation

A light emitter according to a first variation of the first embodiment will next be described with reference to the drawings. FIG. 6 is a cross-sectional view diagrammatically showing a light emitter 110 according to the first variation of the first embodiment. In FIG. 6 and FIGS. 7 and 8, which will be shown below, the axes X, Y, and Z are drawn as three axes perpendicular to one another.

In the following description of the light emitter 110 according to the first variation of the first embodiment, a member having the same function as the function of a constituent member of the light emitter 100 described above has the same reference character and will not be described in detail. The same holds true for a light emitter according to a second variation of the first embodiment described below.

In the light emitter 100 described above, the irregular shape of the second surface 31 of the phosphor 30 is formed by the planar plate section 32 and the protruding sections 34 of the phosphor 30, as shown in FIG. 1. In contrast, in the light emitter 110, the irregular shape of the second surface 31 is formed by a planar plate section 22 and a protruding section 24 of the base 20, as shown in FIG. 6. The irregular shape of the second surface 31 is a shape that reflects the shapes of the planar plate section 22 and the protruding section 24. The first surface 21 of the base 20 has the irregular shape.

The base 20 includes the planar plate section 22 and the protruding section 24. The planar plate section 22 has the shape of a planar plate.

The protruding section 24 protrudes from the planar plate section 22 toward the positive side of the axis-Z direction. The protruding section 24 has a columnar shape. The protruding section 24 has an upper surface (surface facing positive side of axis-Z direction in example shown in FIG. 6) 24a and a side surface (surface perpendicular to upper surface 24a in example shown in FIG. 6) 24b. The light L is incident on the phosphor 30 provided on the upper surface 24a and the phosphor 30 provided on the side surface 24b. The light L is further incident on the phosphor 30 provided on an upper surface 22a of the planar plate section 22. The optical axis A of the light L intersects a normal R to the upper surface 24a. In the example shown in FIG. 6, the normal R is parallel to the axis Z.

The protruding section 24 is formed of a plurality of protruding sections 24. The plurality of protruding sections 24 are so provided as to be separate from one another. The shape and size of the protruding sections 24 and the arrangement of the plurality of protruding sections can be those in the description of the protruding sections 34 of the phosphor 30 described above. The protrusions 31a are formed of the protruding sections 24.

In the present embodiment, "the direction in which the protrusions 31a protrude" is the direction of a center line β, which connects a center point C3 of a bottom surface 124 of any of the protruding sections 24 in the plan view viewed along the normal R to a center point C4 of a cross section 126 of the protruding section 24, which is located in the position corresponding to half the height of the protruding section 24 (maximum dimension along normal R), in the plan view viewed along the normal R. The bottom surface of the protruding section 24 is a surface of the protruding section 24 that is the surface in contact with the planar plate section 22. The "center point C3 of a bottom surface 124," the "center point C4 of the cross section 126," and the "cross section 126 of the protruding section 24, which is located in the position corresponding to half the height of the protruding section 24" can be those in the description of "the center point C1 of a bottom surface 134," "the center point C2 of the cross section 136," and "the cross section 136 of the protruding section 34, which is located in the position corresponding to half the height of the protruding section 34" described above.

The phosphor 30 is so provided as to cover the planar plate section 22 and the protruding sections 24. The thickness of the phosphor 30 is smaller than the height of the protruding sections 24.

In the method for manufacturing the light emitter 110, a substrate is patterned, for example, by photolithography and etching to form the base 20 including the planar plate section 22 and the protruding sections 24. The phosphor 30 is then deposited on the first surface 21 of the base 20, for example, by CVD or sputtering.

The light emitter 110 can provide the same effects as those provided by the light emitter 100 described above.

In the light emitter 110, the base 20 includes the planar plate section 22, which has the shape of a planar plate, and the protruding sections 24, which protrude from the planar plate section 22, and the irregular shape of the second surface 31 is formed by the planar plate section 22 and the protruding sections 24. Therefore, in the light emitter 110, the irregular shape can be formed in the second surface 31 of the phosphor 30 without patterning the phosphor 30 but only by depositing the phosphor 30 on the first surface 21 of the base 20.

1.3.2. Second Variation

A light emitter according to a second variation of the first embodiment will next be described with reference to the drawings. FIG. 7 is a cross-sectional view diagrammatically showing a light emitter 120 according to the second variation of the first embodiment.

In the light emitter 100 described above, the irregular shape of the second surface 31 of the phosphor 30 is formed by the planar plate section 32 and the protruding sections 34 of the phosphor 30, as shown in FIG. 1. In contrast, in the light emitter 120, the irregular shape of the second surface 31 is formed by a planar plate section 42 and a protruding section 44 of a base layer 40, as shown in FIG. 7. The irregular shape of the second surface 31 is a shape that reflects the shapes of the planar plate section 42 and the protruding section 44.

The base layer 40 is provided on the first surface 21 of the base 20. The base layer 40 is provided between the base 20 and the phosphor 30. The material of the base layer 40 differs from the material of the base 20. The material of the base layer 40 is, for example, a semiconductor material, such as GaN and InGaN.

The base layer 40 includes the planar plate section 42 and the protruding section 44. The planar plate section 42 is provided on the first surface 21. The planar plate section 42 has the shape of a planar plate.

The protruding section 44 protrudes from the planar plate section 42 toward the positive side of the axis-Z direction. The protruding section 44 has a columnar shape. The protruding section 44 has an upper surface (surface facing positive side of axis-Z direction in example shown in FIG. 7) 44a and a side surface (surface perpendicular to upper surface 44a in example shown in shown in FIG. 7) 44b. The light L is incident on the phosphor 30 provided on the upper surface 44a and the phosphor 30 provided on the side surface 44b. The light L is further incident on the phosphor 30 provided on an upper surface 42a of the planar plate section 42.

The protruding section 44 is formed of a plurality of protruding sections 44. The plurality of protruding sections 44 are so provided as to be separate from one another. The shape and size of the protruding sections 44 and the arrangement of the plurality of protruding sections can be those in the description of the protruding sections 34 of the phosphor 30 described above. The protrusions 31a are formed of the protruding sections 44.

In the present embodiment, "the direction in which the protrusions 31a protrude" is the direction of a center line γ, which connects a center point C5 of a bottom surface 144 of any of the protruding sections 44 in the plan view viewed along the normal P to a center point C6 of a cross section 146 of the protruding section 44, which is located in the position corresponding to half the height of the protruding section 44 (maximum dimension along normal P), in the plan view viewed along the normal P. The bottom surface of the protruding section 44 is a surface of the protruding section 44 that is the surface in contact with the planar plate section 42. The "center point C5 of a bottom surface 144," the "center point C6 of the cross section 146," and the "cross section 146 of the protruding section 44, which is located in the position corresponding to half the height of the protruding section 44" can be those in the description of "the center point C1 of a bottom surface 134," "the center point C2 of the cross section 136," and "the cross section 136 of the protruding section 34, which is located in the position corresponding to half the height of the protruding section 34" described above.

The phosphor 30 is so provided as to cover the planar plate section 42 and the protruding sections 44. The phosphor 30 is provided over the first surface 21 of the base 20 via the base layer 40. The thickness of the phosphor 30 is smaller than the height of the protruding sections 44.

In the method for manufacturing the light emitter 120, a base film (not shown) is deposited on the first surface of the base 20, for example, by MOCVD (metal organic chemical vapor deposition) or MBE (molecular beam epitaxy), and the light emitting film is patterned by photolithography and etching. The etching is terminated before the base 20 is exposed. The base layer 40 including the planar plate section 42 and the protruding sections 44 can thus be formed. The phosphor 30 is then deposited on the base layer 40, for example, by CVD or sputtering.

The light emitter 120 can provide the same effects as those provided by the light emitter 100 described above.

The light emitter 120 is configured as follows: The light emitter 120 includes the base layer 40 provided between the base 20 and the phosphor 30; the phosphor 30 is provided over the first surface 21 via the base layer 40; the base layer 40 includes the planar plate section 42, which is provided on the first surface 21 and has the shape of a planar plate, and the protruding sections 44, which protrude from the planar plate section 42; and the irregular shape of the second surface 31 is formed by the planar plate section 42 and the protruding sections 44. Therefore, in the light emitter 120, the irregular shape can be formed on the second surface 31 of the phosphor 30 without patterning the phosphor 30 or the base 20.

The light emitter 120 may not include the planar plate section 42, and the protruding sections 44 may be provided on the first surface 21, as shown in FIG. 8. In this case, the phosphor 30 is so provided as to cover the protruding sections 44 and the first surface 21. In this case, the bottom surface of each of the protruding sections 44 is a surface of the protruding section 44 that is the surface in contact with the base 20.

2. Second Embodiment

2.1. Light Emitter

A light emitter according to a second embodiment will next be described with reference to the drawings. FIG. 9 is a cross-sectional view diagrammatically showing a light emitter 200 according to the second embodiment. In FIG. 9, the axes X, Y, and Z are drawn as three axes perpendicular to one another.

In the following description of the light emitter 200 according to the second embodiment, a member having the same function as the function of a constituent member of the light emitter 100 described above has the same reference character and will not be described in detail.

The light emitter 200 differs from the light emitter 100 described above in that the light source 10 includes a light emitting device 12, which emits light, and an optical element 14, which deflects the optical axis A of the light from the light emitting device 12, as shown in FIG. 9. The light source 10 of the light emitter 200 further includes a light collection system 16 and a lens 18.

The light emitting device 12 is, for example, a laser or an LED. The light emitting device 12 is formed, for example, of a plurality of (three in example shown in FIG. 9) light emitting devices 12. In the example shown in FIG. 9, the light emitting devices 12 each emit light in the axis-Z direction.

The light emitted from each of the light emitting devices 12 enters the light collection system 16. The light collection system 16 includes lenses 16a, which are a plurality of convex lenses, and a lens 16b, which is a convex lens that the light via each of the plurality of lenses 16a enters. The light collection system 16 is disposed in the optical axis A of the light emitted from the light emitting devices 12 and collects the light emitted from each of the plurality of light emitting devices 12.

The light having exited out of the light collection system 16 enters the lens 18. The lens 18 parallelizes the light emitted from each of the light emitting devices 12.

The light having exited out of the lens 18 is incident on the optical element 14. The optical element 14 deflects the optical axis A of the light from each of the light emitting devices 12 and reflects the light obliquely with respect to the irregular shape of the second surface 31 of the phosphor 30. The light source 10 can thus output the light obliquely with respect to the irregular shape of the second surface 31. The optical element 14 is, for example, a mirror. In the second embodiment of the disclosure, the expression stating that the light source 10 radiates the light L obliquely with respect to the irregular shape of the second surface 31 is an expression including the state in which the light source 10 directly radiates the light L obliquely with respect to the irregular shape of the second surface 31 and the light source 10 radiates the light L obliquely with respect to the irregular shape of the second surface 31 with the optical axis A of the light L deflected by the optical element 14 (with the direction of the optical axis A changed).

As long as the light source 10 radiates the light L obliquely with respect to the irregular shape of the second surface 31, the optical element 14 is not limited to a mirror and may, for example, instead be a prism, a diffraction grating, or a half-silvered mirror. The optical element 14 may still instead be a computer-generated hologram (CGH). In the case where the optical element 14 is a CGH, the intensity distribution of the light outputted from the light source 10 may be so controlled that the intensity of the light has high uniformity.

The light emitter 200 can provide the same effects as those provided by the light emitter 100 described above.

In the light emitter 200, the light source 10 includes the light emitting devices 12, which each emits light, and the optical element 14, which deflects the optical axis A of the light emitted from each of the light emitting devices 12. The light emitter 200 therefore allows the light emitted from each of the light emitting devices 12 to be incident on the phosphor 30 via the optical element 14. The light emitter 200 therefore allows the light emitting devices 12 to be arranged with high flexibility.

2.2. Method for Manufacturing Light Emitter

A method for manufacturing the light emitter 200 according to the second embodiment will next be described. The method for manufacturing the light emitter 200 according to the second embodiment is basically the same as the method for manufacturing the light emitter 100 according to the first embodiment described above except that the light emitting devices 12, the optical element 14, the light collection system 16, and the lens 18 are disposed in predetermined positions. The method for manufacturing the light emitter 200 will therefore not be described in detail.

2.3. Variation of Light Emitter

A light emitter according to a variation of the second embodiment will next be described with reference to the drawings. FIG. 10 is a cross-sectional view diagrammatically showing a light emitter 210 according to the variation of the second embodiment. In FIG. 10, the axes X, Y, and Z are drawn as three axes perpendicular to one another.

In the following description of the light emitter 210 according to the variation of the second embodiment, a member having the same function as the function of a constituent member of the light emitter 100 or 200 described above has the same reference character and will not be described in detail.

The light emitter 210 differs from the light emitter 200 described above in that the light emitter 210 includes a driver 50, which rotates the base 20 around an axis (imaginary axis) Q, which is parallel to the normal P, as an axis of rotation, as shown in FIG. 10. The axis of rotation Q is an axis extending in the direction in which the protrusions 31a, which form the irregular shape of the second surface 31, extend. The light emitter 210 further includes a support shaft 52.

The driver 50 is, for example, a motor. The support shaft 52 connects the driver 50 to the base 20. The support shaft 52 extends in the axis-Z direction from the driver 50 to the base 20. The support shaft 52 is provided along the axis of rotation Q. When the driver 50 is driven, the support shaft 52 rotates. The base 20 can thus rotate around the axis of rotation Q. The axis of rotation Q may pass through the center of the base 20 in the plan view.

The light emitter 210 can provide the same effects as those provided by the light emitter 200 described above.

The light emitter 210 includes the driver 50, which rotates the base 20 around the axis Q, which extends in the direction in which the protrusions 31a, which form the irregular shape of the second surface 31, extend, as the axis of rotation. The light emitter 210 can therefore prevent a fixed region of the phosphor 30 from being irradiated with the light outputted from the light source 10 so that the region melts.

Although not shown, in the light emitters 110 and 120 described above, the light source 10 may include the light emitting devices 12, the optical element 14, the light collection system 16, and the lens 18. Further, although not shown, the light emitters 100, 110, and 120 described above may include the driver 50 and the support shaft 52.

3. Third Embodiment

3.1. Projector

A projector according to a third embodiment will next be descried with reference to the drawings. FIG. 11 diagrammatically shows a projector 500 according to the third embodiment.

A projector according to an embodiment of the disclosure includes a light emitter according to an embodiment of the disclosure. The following description will be made of the projector 500 including the light emitter 200 as the light emitter according to an embodiment of the disclosure.

The projector 500 includes an enclosure (not shown) and a light source module 510, a color separation system 520, liquid crystal light valves (light modulators) 530R, 530G, and 530B, a light combining element 540, and a projection system 550 provided in the enclosure.

The projector 500 generally operates as follows: Light outputted from the light source module 510 is separated by the color separation system 520 into a plurality of color light fluxes. The plurality of separated color light fluxes from the color separation system 520 are incident on the corresponding liquid crystal light valves 530R, 530G, and 530B and modulated thereby. The plurality of color light fluxes modulated by the liquid crystal light valves 530R, 530G, and 530B enter the light combining element 540 and are combined with one another. The combined light from the light combining element 540 is enlarged by the projection system 550 and projected thereby on a screen 560. A full-color projection image is thus displayed.

The components of the projector 500 will be described below.

The light source module 510 includes the light emitter 200, a collimation system 511, lens arrays 512 and 513, a polarization converter 514, and a superimposing lens 515.

The light emitter 200 outputs the light emitted from the phosphor 30 upon reception of the light outputted from the light source 10. For example, the phosphor 30 receives blue light outputted from the light source 10 and emits yellow light. The optical element 14 is a half-silvered mirror. Part of the blue light outputted from the light source 10 passes through the optical element 14.

The collimation system 511 includes a lens 511a, which prevents the light emitted from the phosphor 30 from spreading, and a lens 511b, which parallelizes the light having exited out of the lens 511a, and the collimation system 511 as a whole parallelizes the light emitted from the phosphor 30. The lenses 511a and 511b are each formed of a convex lens.

The lens arrays 512 and 513 homogenize the luminance distribution of the light having exited out of the collimation system 511. The lens array 512 includes a plurality of lenses 512a. The lens array 513 includes a plurality of lenses 513a. The lenses 512a correspond to the lenses 513a in a one-to-one relationship. The light having exited out of the collimation system 511 enters the plurality of lenses 512a in a spatially separate form. The lenses 512a each focus the light incident thereon onto the corresponding lens 513a. Secondary light source images are thus formed on the plurality of lenses 513a. The outer shapes of the lenses 512a and 513a are substantially similar to the outer shapes of image formation regions of the liquid crystal light valves 530R, 530G, and 530B.

The polarization converter 514 aligns the polarization states of the light fluxes having exited out of the lens arrays 512 and 513 with one another. The polarization converter 514 outputs the light incident thereon, for example, in the form of P-polarized light.

The superimposing lens 515 superimposes the light fluxes having exited out of the polarization converter 514 on one another in illumination receiving regions. The light having exited out of the superimposing lens 515 has a uniform luminance distribution because the light has been spatially divided into light fluxes, which are then superimposed on one another.

The color separation system 520 includes dichroic mirrors 521 and 522, mirrors 523, 524, 525, and 526, relay lenses 527 and 528, and field lenses 529R, 529G, and 529B. The dichroic mirrors 521 and 522 are each, for example, a dielectric multilayer film layered on a surface of a glass plate. The dichroic mirrors 521 and 522 are each characterized by selectively reflecting color light that belongs to a predetermined wavelength band and transmitting color light that belong to the other wavelength band. In the description, the dichroic mirrors 521 and 522 reflect green light.

The light having exited out of the superimposing lens 515 is yellow light Y and is incident on the dichroic mirror 521. Red light R out of the yellow light Y passes through the dichroic mirror 521, is incident on the mirror 523, is reflected off the mirror 523, and enters the field lens 529R. The red light R is parallelized by the field lens 529R and then incident on the liquid crystal light valve 530R.

Green light G out of the yellow light Y is reflected off the dichroic mirror 521, then further reflected off the dichroic mirror 522, and enters the field lens 529G. The green light G is parallelized by the field lens 529G and then incident on the liquid crystal light valve 530G.

The blue light B having passed through the optical element 14 is reflected off the mirror 524, then travels via the dichroic mirrors 521 and 522 and the relay lens 527, is reflected off the mirror 525, further passes through the relay lens 528, is reflected off the mirror 526, and enters the field lens 529B. The blue light B is parallelized by the field lens 529B and then incident on the liquid crystal light valve 530B.

The liquid crystal light valves 530R, 530G, and 530B are each formed, for example, of a light modulator, such as a transmissive liquid crystal light valve. The liquid crystal light valves 530R, 530G, and 530B are electrically coupled to a signal source (not shown) that supplies an image signal containing image information, such as a PC. The liquid crystal light valves 530R, 530G, and 530B each modulate the light incident thereon on a pixel basis based on the supplied image signal to form an image. The liquid crystal light valves 530R, 530G, and 530B form a red image, a green image, and a blue image, respectively. The light fluxes modulated (images formed) by the liquid crystal light valves 530R, 530G, and 530B enter the light combining element 540.

The light combining element 540 is formed, for example of a dichroic prism. The dichroic prism has a structure in which four triangular columnar prisms are bonded to each other. The surfaces where the triangular columnar prisms are bonded form inner surfaces of the dichroic prism. A mirror surface that reflects the red light and transmits the green light and a mirror surface that reflects the blue light and transmits the green light are so formed on the inner surfaces of the dichroic prism that the mirror surfaces intersect each other at right angles. The green light having entered the dichroic prism passes through the mirror surfaces and directly exits out of the dichroic prism. The red light and the blue light having entered the dichroic prism are selectively reflected off or pass through the mirror surfaces and exit in the same direction in which the green light exits. The three color light fluxes (images) are thus superimposed on and combined with one another, and the combined color light is enlarged by the projection system 550 and projected thereby on the screen 560.

The projector 500 includes the light emitter 200 capable of improving the light emission efficiency. The projector 500 can therefore output light having high luminance.

In the projector 500, the optical element 14 is a half-silvered mirror. The projector 500 can therefore output the red light, the green light, and the blue light without using a plurality of light source modules 510, whereby the size of the projector 500 can be reduced.

In the example described above, transmissive liquid crystal light valves are used as the light modulators and may be replaced with light valves that are not based on a liquid crystal material or reflective light valves. Examples of such light valves may include a reflective liquid crystal light valve and a digital micromirror device. The configuration of the projection system is changed as appropriate in accordance with the type of light valves used in the projector.

3.2. Variations of Projector 3.2.1. First Variation

A projector according to a first variation of the third embodiment will next be described with reference to the drawings. FIG. 12 diagrammatically shows a projector 600 according to the first variation of the third embodiment.

In the following description of the projector 600 according to the first variation of the third embodiment, a member having the same function as the function of a constituent member of the projector 500 described above has the same reference character and will not be described in detail.

The projector 500 described above includes the light emitter 200, as shown in FIG. 11. In contrast, the projector 600 includes the light emitter 210, as shown in FIG. 12. The projector according to an embodiment of the disclosure does not necessarily include the light emitter 200 or 210 and can include a light emitter according to an embodiment of the disclosure.

The projector 600 can provide the same effects as those provided by the projector 500 described above.

The projector 600, which includes the light emitter 210, can prevent a fixed region of the phosphor 30 from being irradiated with the light outputted from the light source 10 so that the region melts.

3.2.2. Second Variation

A projector according to a second variation of the third embodiment will next be described with reference to the drawings. FIG. 13 diagrammatically shows a projector 700 according to the second variation of the third embodiment.

In the following description of the projector 700 according to the second variation of the third embodiment, a member having the same function as the function of a constituent member of the projector 500 or 600 described above has the same reference character and will not be described in detail.

In the projector 500 described above, the optical element 14 is a half-silvered mirror, as shown in FIG. 11. In contrast, in the projector 700, the optical element 14 is a mirror and does not transmit the light emitted from the light emitting devices 12, as shown in FIG. 13.

The projector 700 includes a light source module 710. The light source module 710 includes the light emitting devices 12, the light collection system 16, the lens arrays 512 and 513, the polarization converter 514, and the superimposing lens 515. The light source module 710 outputs blue light B.

The blue light B outputted from the light source module 710 passes through the field lens 529R and is incident on the liquid crystal light valve 530B.

In the projector 700, the light source module 710 includes the light emitter 210. The color separation system 520 does not include the dichroic mirror 522, the mirror 524, 525, or 526, or the relay lens 527 or 528 but includes a mirror 722, which reflects the green light G.

The projector 700 can provide the same effects as those provided by the projector 500 described above.

In the disclosure, part of the configurations thereof may be omitted and the embodiments and variations may be combined with each other to the extent that the features and effects described in the present application are provided.

The disclosure encompasses substantially the same configuration as the configuration described in any of the embodiments (for example, a configuration having the same function, using the same method, and providing the same result or a configuration having the same purpose and providing the same effect). Further, the disclosure encompasses a configuration in which an inessential portion of the configuration described in any of the embodiments is replaced. Moreover, the disclosure encompasses a configuration that provides the same workings/effects as those provided by the configuration described in any of the embodiments or a configuration that can achieve the same purpose as that achieved by the configuration described in any of the embodiments. Further, the disclosure encompasses a configuration in which a known technology is added to the configuration described in any of the embodiments.

The invention claimed is:

1. A light emitter comprising:
   a base;
   a light source that outputs light; and
   a phosphor that is provided in a form of a film at a first surface of the base and emits light when irradiated with the light outputted from the light source,
   wherein the phosphor includes:
     a planar plate section that is provided at the first surface and has a shape of a planar plate; and
     a plurality of protruding sections that protrude from the planar plate section along a protruding direction, wherein an irregular structure is formed by the planer plate section and the plurality of protruding sections of the phosphor,
   when the light source radiates the light obliquely with respect to the irregular structure, a part of the light from the light source passes through the plurality of protruding sections, and
   when the light source radiates the light, the part of the light that has passed through one protruding section of the plurality of protruding sections is incident on both the planar plate section and an adjacent protruding section that is adjacent to the one protruding section of the plurality of protruding sections.

2. The light emitter according to claim 1,
   wherein a direction of an optical axis of the light outputted from the light source intersects the protruding direction.

3. The light emitter according to claim 1,
   further comprising a driver that is configured to rotate the base around a rotation axis extending along the protruding direction.

4. The light emitter according to claim 1,
wherein the light source includes
a light emitting device that emits the light, and
an optical element that deflects an optical axis of the light emitted from the light emitting device.

5. The light emitter according to claim 1,
wherein each of the plurality of protruding sections is hexagonal-shaped in a plan view viewed along a normal to the first surface.

6. A projector comprising:
a base;
a light source that outputs light; and
a phosphor that is provided in a form of a film at a first surface of the base and emits light when irradiated with the light outputted from the light source,
wherein the phosphor includes:
  a planar plate section that is provided at the first surface and has a shape of a planar plate; and
  a plurality of protruding sections that protrude from the planar plate section, wherein an irregular structure is formed by the planer plate section and the plurality of protruding sections of the phosphor,
the light source radiates the light obliquely with respect to the irregular structure, and
when the light source radiates the light, the light that has passed through one protruding section of the plurality of protruding sections is incident on both the planar plate section and an adjacent protruding section that is adjacent to the one protruding section of the plurality of protruding sections.

7. A light emitter comprising:
a base;
a light source that outputs light; and
a phosphor that is provided in a form of a film at a first surface of the base and emits light when irradiated with the light outputted from the light source,
wherein the base includes:
  a planar plate section having a shape of a planar plate; and
  a plurality of protruding sections that protrude from the planar plate section, wherein the first surface has an irregular structure that is formed by the planar plate section and the plurality of protruding sections,
the phosphor covers the planar plate section and the plurality of protruding sections of the base,
when the light source radiates the light obliquely with respect to the irregular structure, a part of the light passes through the phosphor and passes through the plurality of protruding sections of the base, and
when the light source radiates the light, the part of the light that has passed through the phosphor on one protruding section of the plurality of protruding sections and the one protruding section of the plurality of protruding sections is incident on both the phosphor on the planar plate section and the phosphor on an adjacent protruding section that is adjacent to the one protruding section of the plurality of protruding sections.

8. A light emitter comprising:
a base;
a light source that outputs light;
a phosphor that is provided in a form of a film at a first surface of the base and emits light when irradiated with the light outputted from the light source; and
a base layer provided between the base and the phosphor, the phosphor being provided at the first surface of the base via the base layer,
the base layer includes:
  a planar plate section provided at the first surface of the base and having a shape of a planar plate; and
  a plurality of protruding sections that protrude from the planar plate section, wherein an irregular structure is formed by the planer plate section and the plurality of protruding sections of the base layer,
the phosphor covers the planar plate section and the plurality of protruding sections of the base layer,
when the light source radiates the light obliquely with respect to the irregular structure, a part of the light passes through the phosphor and passes through the plurality of protruding sections of the base layer, and
when the light source radiates the light, the part of the light that has passed through one protruding section of the plurality of protruding sections and the phosphor on the one protruding section of the plurality of protruding sections is incident on both the phosphor on the planar plate section and the phosphor on an adjacent protruding section that is adjacent to the one protruding section of the plurality of protruding sections.

* * * * *